US006802038B1

(12) United States Patent
Yu

(10) Patent No.: US 6,802,038 B1
(45) Date of Patent: Oct. 5, 2004

(54) CYCLIC REDUNDANCY CHECK COMPUTATION ALGORITHM

(75) Inventor: Xiaoming Yu, Campbell, CA (US)

(73) Assignee: ArrayComm, Inc., San Jose, CA (US)

(*) Notice: Subject to any disclaimer, the term of this patent is extended or adjusted under 35 U.S.C. 154(b) by 653 days.

(21) Appl. No.: 09/751,863

(22) Filed: Dec. 30, 2000

(51) Int. Cl.[7] .................................................. H03M 13/00
(52) U.S. Cl. ......................................................... 714/758
(58) Field of Search ................................ 714/758–759, 714/799, 48, 57; 707/1, 10; 709/218, 246; 370/389, 513

(56) References Cited

U.S. PATENT DOCUMENTS

| | | | |
|---|---|---|---|
| 6,195,780 B1 | * | 2/2001 | Dravida et al. ............. 714/758 |
| 6,640,301 B1 | * | 10/2003 | Ng ............................... 713/156 |
| 2002/0172198 A1 | * | 11/2002 | Kovacevic .................. 370/389 |

OTHER PUBLICATIONS

Jain, R. "A comparison of hashing schemes for address lookup in computer networks;"Communications, IEEE Transactions on;Oct. 1992; On page(s): 1570–1573; vol.: 40, Issue: 10.*

Proakis, John G., "Digital Communications", McGraw–Hill Series in Electrical and Computer Engineering, 3rd Edition, Mar. 1995, pp. 413–465.

Chase, David, "A Class of Algorithms for Decoding Block Codes with Channel Measurement Information", IEEE Transactions on Information Theory, vol. IT–18, No. 1, Jan. 1972, pp. 170–182.

* cited by examiner

*Primary Examiner*—Guy J. Lamarre
(74) *Attorney, Agent, or Firm*—Blakey Sokoloff Taylor & Zafman LLP

(57) ABSTRACT

A receiving device receives a stream of information and appended thereto a cyclic redundancy check (CRC) value for the information stream. A new CRC value is computed for the information stream and compared to the CRC value. If the CRC value and the new CRC value differ, then a segment of the information stream is altered, and a pointer based on the altered information stream is obtained. The pointer points to a table from which a value is obtained that is used in revising the new CRC value. The CRC value is compared to the new CRC value as revised, and if they still differ, again the information stream is altered, the new CRC value revised in connection therewith, and the CRC value again compared to the new CRC as revised. This process repeats until such time as any data integrity error in the information stream is corrected, or some other appropriate action is taken to end the process.

34 Claims, 2 Drawing Sheets

| BIT POSITION 105 | VALUE 110 |
|---|---|
| 00001 | VALUE 1 |
| 00010 | VALUE 2 |
| 00100 | VALUE 3 |
| 01000 | VALUE 4 |
| 10000 | VALUE 5 |

FIG. 1

CYCLIC REDUNDANCY CHECK COMPUTATION ALGORITHM

FIELD OF THE INVENTION

The present invention is related to a method for efficiently calculating a cyclic redundancy check (CRC).

BACKGROUND OF THE INVENTION

The use of a Cyclic Redundancy Check (CRC) to verify the integrity of data is well known in the art. Essentially, a transmitter, or source, of data, or perhaps a device associated therewith, computes a CRC value on data that is to be transmitted. The data is then transmitted along with the computed CRC value to a receiver or destination. The receiver of the data, or an associated device, upon receiving the data and the transmitted CRC value, computes a new CRC value on the received data using the same CRC algorithm as used by the source. The new CRC value computed on the received data is compared to the transmitted CRC value computed and transmitted by the source along with the data. If the two CRC values match, the data was transmitted and received without corruption.

If the data received by the destination differs in any regard from the data that was to be transmitted by the source, the CRC transmitted with the data does not match the new CRC calculated by the receiver, and the destination and or source react accordingly. The most common approach is to use feedback and retransmission. For example, the destination may discard the data, and/or notify the source that an error likely occurred at least in receiving the data, and the source may then retransmit the data, according to a protocol by which the source and destination communicate with each other. Another more efficient approach is to utilize received data, both information data and CRC values, to intelligently detect and correct errors incurred during transmission, such as the Maximum-likelihood detector and the Chase decoder. These methods, however, are inherently more computation intensive, and may require a large amount of CRC recomputation as in the case of the Chase decoder.

It should be noted here that the term data is meant to encompass any type, format, or length of data, and likely is received as a string of binary digits. It may be that the data is actually transmitted as a string of binary digits in a digital signal, or transmitted as an analog signal and converted to a string of bits in a digital signal for processing by logic within an integrated circuit. Moreover, the transmitter and receiver may represent any two devices that communicate with either other, such as peer devices communicating via an internetwork, client and server devices communicating via the Internet, or user terminals communicating with a base station in a cellular radio network communication system, etc. Moreover, CRCs values may be utilized to check the integrity of data in virtually every situation where data is transmitted, regardless of the type of transmission link or distance between the source and destination. For example, the process of checking for data integrity is as applicable to data packets transmitted over a data bus coupling logic circuits of a chipset as between cells of data transmitted via a radio frequency spectrum between a base station and user terminal in a wireless network.

In the prior art, Chase decoders operate in conjunction with a receiver to recover from an integrity error in the received data stream. A Chase decoder essentially intelligently rearranges a number of the symbols, such as binary digits, in a string of symbols (e.g., binary digits) comprising the data if the new CRC calculated by the receiver does not match the CRC transmitted with the data. Chase decoders intelligently guess which binary digits in the data stream are incorrect, and "flip" such binary digits, or bits. Chase decoders are well known in the art, and therefore, the details of their operation are left to the reader.

After flipping one or more binary digits in a string of binary digits comprising the received data, the CRC for the string of bits comprising the data is then recalculated and compared to the CRC transmitted with the data. This process is iterative the decoder continues to flip bits, the CRC is recalculated, and the recalculated CRC is then compared to the transmitted CRC until the CRCs match, thus obviating the need to retransmit the data. However, recalculating the CRC, especially if the string of binary digits over which the CRC is calculated is large, can be computationally intensive. For an embedded controller, or a device with limited computing capabilities or battery power, such as a user terminal in a wireless communications network, such computationally intensive calculations are not desirable.

SUMMARY

An embodiment of the present invention contemplates receiving a stream of information and appended thereto a cyclic redundancy check (CRC) value for the information stream. A new CRC value is computed for the received information stream and compared to the CRC value transmitted with the information stream. If the transmitted CRC value and the new CRC value are different, then a portion of the information stream is altered, and a pointer based on the altered information stream is obtained which points to a table. An entry pointed to in the table provides a predefined value to be used in revising the new CRC value. The new CRC value is revised by taking into account the predefined value and the new CRC value. The transmitted CRC value is again compared to the new CRC value as revised, and if the CRCs. still do not match, the information stream may be altered again, the new CRC value revised yet again, and the transmitted CRC value again compared to the new CRC as revised.

BRIEF DESCRIPTION OF THE DRAWINGS

The present invention is illustrated by way of example, and not necessarily by way of limitation in the figures of the accompanying drawings in which like reference numerals refer to similar elements.

FIG. 1 is a diagram of a data structure as utilized in an embodiment of the present invention.

DETAILED DESCRIPTION OF THE INVENTION

Figure 2:
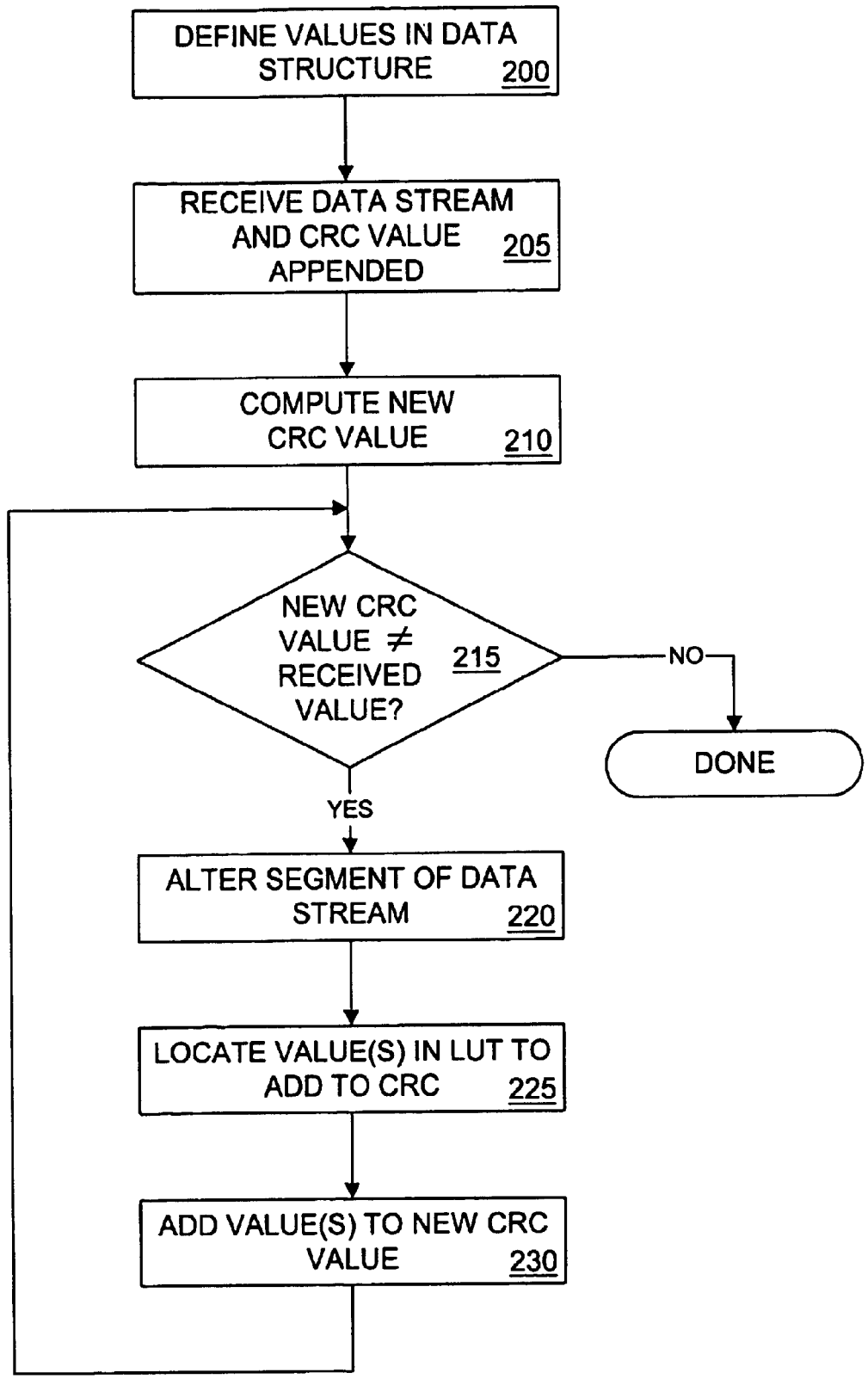
FIG. 2 is a flow diagram of a process in one embodiment of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description which follow are presented in terms of algorithms and symbolic representations of operations on data within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as binary digits, values, elements, symbols, characters, terms, numbers, or the like.

It should be borne in mind, however, that all of these and similar terms are to be associated with the appropriate physical quantities and are merely convenient labels applied to these quantities. Unless specifically stated or otherwise apparent from the following discussion throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatuses for performing the operations herein. These apparatuses may be specially constructed for the required purposes, or may comprise a general-purpose computer selectively activated or reconfigured by a computer program stored in the computer. Such a computer program may be stored in a machine-readable storage medium, such as, but not limited to, any type of magnetic or other disk storage media including floppy disks, optical storage media, CD-ROMs, and magnetic-optical disks, read-only memories (ROMs), random access memories (RAMs), EPROMs, EEPROMs, magnetic or optical cards, flash memory devices; electrical, optical, acoustical or other form of propagated signals (e.g., carrier waves, infrared signals, digital signals, etc.), or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A Cyclic Redundancy Check (CRC) value typically is a multiple binary digit value, e.g., 16 bits or 32 bits, appended to the end of a burst, block, or stream, of data for purposes of detecting an error in the data. A receiving device, by comparing the CRC received with the data with a new CRC calculated based on the received data, is able to detect errors that occur in the transmission of the data.

In one embodiment, during construction of the data stream to be transmitted by the transmitting device, the CRC is computed by applying the data stream through a shift register with a feedback pattern described by the polynomial $g(X)=X^{16}+X^{12}+X^{5}+1$ and with the initial values of the shift register set to the binary digit value of 1.

In accordance with the present invention, a data structure accessible to the receiving device is provided, the data structure comprising a number of entries at least equal to the number of symbols or binary digits that is expected to be present in a data stream received at the receiving device. Each entry comprises a pre-defined value that represents the incremental change in the CRC value computed for the data stream based on a particular symbol or binary digit position in the data stream being set to a value of binary one. With reference to FIG. 1, a simple data structure 100 is illustrated. For each binary digit position 105 in the received data stream, a separate entry is provided. Thus, in the illustrated example, a data stream comprising 5 binary digits is contemplated. It is appreciated, however, that the size or length of the data stream may be any number of binary digits. In the embodiment illustrated in FIG. 1, the data structure has at least a number of entries equal to the length of the data stream, in this instance, 5 binary digits. Thus, 5 entries are provided, wherein each entry is indexed by a different binary digit position in the data stream.

Each entry further includes a pre-defined value 110. The pre-defined value represents the difference in the CRC value computed for the data stream based on the corresponding binary digit position in the data stream being set to a value of binary one. Thus, if the first bit position 106 in the data stream is set to a binary one, the value 1 at 111 is reflected in the CRC value computed on the data stream. If, the second bit position 106 is set to a binary one, the value 2 at 112 is added to the CRC value computed for the data stream, and so on.

The values 110 in the data structure are computed by the same CRC algorithm as utilized by or on behalf of the transmitting device. In one embodiment, the value is computed by applying the data stream represented by the corresponding value in the bit position field of the data structure through a shift register, for example, with the same feedback pattern as described above, with the initial register values in the shift register initialized to zero. Thus, for example, the value 5 at 115 is computed by applying the data stream represented by the corresponding value 109 (the binary digit string "10000") in the bit position field 105 of the data structure 100 through a shift register, wherein the initial register values in the shift register are initialized to zero.

Chase decoders are utilized in recomputing a new CRC when the new CRC initially or previously calculated by or on behalf of a receiving device does not match a CRC computed based upon and transmitted with a block of data by or on behalf of a transmitting device. The implementation of a Chase decoder requires recomputing a CRC after manipulating selected symbols, such as binary digits, in the received block of data in an attempt to correct one or more of the most likely unreliable symbols (e.g., binary digits) in the received block of data.

The actual number of CRC recomputations depends on the number of unreliable binary digits that are manipulated (e.g., flipped), K, out of N unreliable symbols. For example, for N=6 and K=3, the number of CRC recomputations is 123, and for N=10, K=3, the number of recomputations is 525. As can be appreciated, as the unreliability of the data transmission medium increases, the number of recomputations increases. For transmission environments with significant noise or unreliability, e.g., a wireless radio frequency transmission medium, a fast algorithm is useful in recomputing the new CRC value.

The present invention contemplates recomputing the new CRC value by adding (e.g., modulo 2 adding) at least one of the values in the data structure with the new CRC value to obtain a revised new CRC value. The value that is selected to be added to the new CRC value in recomputing the new CRC value is determined by which binary digits are "flipped" in the data stream in the event the new CRC value fails to match the received CRC value associated with the received data stream, in accordance with, for example, a Chase decoding scheme. A more thorough discussion the process of recomputing a CRC after a number of binary digits in a received data stream have been changed, for example, according the Chase decoding scheme, follows, with reference to FIG. 2.

As an initial matter, a data structure 100 comprising pre-defined values is established at 200 and maintained in a manner such that it is accessible by a receiving device, that is, a device or component receiving a data stream. The data structure essentially is a look up table (LUT) in which the value in each entry is created by providing as input to a shift register a binary digit stream in which a single, unique, bit position is set to a value of one, and all other binary digits in the data stream set to a value of zero. Additionally, the initial register values in the shift register are set to a value of zero.

The number of entries in the data structure is governed by the number of binary digits in the data stream. Thus, for example, if the data stream received by the receiving device is 180 binary digits in length, the data structure includes 180 entries, in which the index for each entry is 180 binary digits in length, and one bit is set to a value of one, while all other bits are set to a value of zero. Each entry sets a different bit position in the index to a value of one, so that the index 105 essentially acts as a binary digit, or bit, mask for selecting a value that defines the extent to which the new CRC value is changed by adding, for example, using modulo-2 addition, in recomputing the new CRC value.

With the data structure in place, the receiver is ready to receive data from a transmitter. At 205, the receiver receives a stream of data, including a CRC value, for example, appended to the stream. In one embodiment, the receiver identifies a number of binary digits in the stream of data that are considered least reliable. The CRC value is computed prior to transmission of the data stream in accordance with a CRC algorithm. The same algorithm is employed at the receiver to compute a new CRC value on the received data at 210. The received CRC value is then compared to the newly computed CRC value at 215. If the new CRC value matches the received CRC value, the data is considered to have been received at the receiver without error.

If the received CRC value computed by the transmitter and the new CRC value computed by the receiver do not match, an error in the transmission of the data is considered to have occurred. Rather than retransmitting, or initiating a request to retransmit the data, the receiver instead alters a segment of the data stream. In one embodiment, the receiver alters a number of binary digits that comprise the data stream at 220. In accordance with one embodiment, the number of bits altered is one. In other embodiments, two or more bits may be altered. The number of bits is altered, for example, in accordance with a Chase decoding scheme, or any other well known or proprietary algorithm for detecting and altering least reliable binary digits in a binary digit stream of data. The Chase decoding scheme identifies those binary digits in the data stream that are considered unreliable, and changes the value of the binary digit. For example, the scheme may identify a single unreliable bit in the data stream, and change the single bit from a value of zero to one, or from a value of one to zero. The Chase decoding scheme is well known in the art, and so further description of the means by which the scheme identifies and changes unreliable bits is not provided herein. It is appreciated that if multiple binary digits are considered unreliable, such bits likely are not contiguous in the data stream, but may be contiguous as well.

At 225, the location or position of the binary digit in the data stream that is identified and changed is used to map to an entry in a data structure, for example, data structure 100. In one embodiment, a single binary digit is changed in the data stream. Thus, a single entry in the data structure is indexed by the corresponding bit mask that identifies the bit position that was changed. In another embodiment, multiple binary digits in the data stream are flipped, and therefore, multiple entries pointed to by the bit masks that identify the bit positions that changed are located in the data structure. Each entry comprises a value that when added, for example, using modulo-2 addition, to the new CRC value, adjusts or revises the new CRC value to reflect the changes made to the number of binary digits in the data stream.

At 230, the entries in the data structure are read, and the values stored therein are obtained. The new CRC then is revised by adding to the new CRC the values 110 corresponding to the entries located in the data structure based on the number of bits in the data stream that were altered.

Upon revising the new CRC value in the manner set forth above, the new CRC value as revised is compared to the received CRC value, at 215. If the new CRC value as revised matches the received CRC value, then the Chase decoding scheme selects and modifies the correct number of binary digits in the data stream. If the new CRC value as revised does not match the received CRC value, then the process described above with respect to steps 220 through 230 are repeated until such time that the CRC values do match, or some other operation is performed.

What is claimed is:

1. A method, comprising:
   receiving an information stream and a cyclic redundancy check (CRC) value for the information stream;
   computing a new CRC value for the information stream;
   comparing the CRC value with the new CRC value;
   if the CRC value and the new CRC value differ, then repeating:
      altering a segment of the information stream to create an altered information stream;
      obtaining a pointer based on the altered information stream;
      obtaining from a data structure a value pointed to by the pointer;
      revising the new CRC value in accordance with the obtained value; and
      comparing the CRC value with the new CRC value as revised.

2. The method of claim 1, wherein receiving an information stream and a cyclic redundancy check (CRC) value for the information stream comprises receiving a string of binary digits representing the information steam and a CRC value derived from the string of binary digits representing the information stream.

3. The method of claim 2, wherein receiving an information stream and a cyclic redundancy check (CRC) value for the information stream further comprises identifying a number of least reliable binary digits in the string of binary digits representing the information stream.

4. The method of claim 3, wherein altering a segment of the information stream to create an altered information stream comprises altering at least one of the number of least reliable binary digits in the string of binary digits representing the information stream to create an altered string of binary digits that represent the information stream.

5. The method of claim 1, wherein receiving an information stream and a cyclic redundancy check (CRC) value for the information stream and computing a new CRC value for the information stream, comprises receiving an information stream and a cyclic redundancy check (CRC) value for the information stream computed in accordance with a CRC algorithm, and computing a new CRC value for the information stream in accordance with the CRC algorithm.

6. The method of claim 5, wherein receiving an information stream and a cyclic redundancy check (CRC) value for the information stream computed in accordance with a CRC algorithm, and computing a new CRC value for the information stream in accordance with the CRC algorithm, comprises receiving a string of binary digits representing the information stream and a cyclic redundancy check (CRC) value computed on the string of binary digits in accordance with a CRC algorithm, and computing a new CRC value on the string of binary digits representing the information stream in accordance with the CRC algorithm.

7. The method of claim 1, wherein altering a segment of the information stream to create an altered information stream comprises altering a segment of a string of binary digits that represents the information stream to create an altered string of binary digits that represent the information stream.

8. The method of claim 7, wherein altering a segment of a string of binary digits that represents the information sun to create an altered string of binary digits that represent the information stream comprises altering a number of binary digits in the string of binary digits that represents the information stream to create an altered string of binary digits that represent the information stream.

9. The method of claim 8, wherein altering a number of binary digits in the string of binary digits that represents the information stream to create an altered string of binary digits that represent the information stream comprises altering a plurality of binary digits in the string of binary digits that represents the information stream to create an altered string of binary digits that represent the information stream.

10. The method of claim 9, wherein altering a plurality of binary digits in the string of binary digits that represents the information stream to create an altered string of binary digits that represent the information stream comprises altering a noncontinguous plurality of binary digits in the string of binary digits that represents the information stream to create an altered string of binary digits that represent the information stream.

11. The method of claim 8, wherein obtaining a pointer based on the altered information stream comprises obtaining a pointer based on the altered string of binary digits that represent the information stream.

12. The method of claim 11, wherein obtaining a pointer based on the altered string of binary digits that represent the information stream comprises obtaining an index based on the altered number of binary digits in the string of binary digits that represents the information stream.

13. The method of claim 12, wherein obtaining an index based on the altered number of binary digits in the string of binary digits that represents the information stream comprises obtaining a mask identifying a position at which the altered number of binary digits is located in the string of binary digits that represents the information steam.

14. The method of claim 13, wherein obtaining from a data structure a value pointed to by the pointer comprises obtaining from a look up table a value indexed by the mask.

15. The method of claim 14, wherein the look up table comprises a number of entries equal to the number of binary digits in the mask.

16. The method of claim 14, wherein the value in each entry of the look up table represents the extent to which the new CRC value will be revised by altering the number of binary digits in the string binary digits that represents the information stream at the position indicated by the mask.

17. The method of claim 14, wherein revising the new CRC value in accordance with the obtained value comprises adding the value indexed by the mask to the new CRC value to create the new CRC value as revised.

18. An article of manufacture, comprising:
a machine accessible medium, the machine accessible medium providing instructions, that when executed by a machine, cause the machine to:
receive an information stream and a cyclic redundancy check (CRC) value for the information stream;
compute a new CRC value for the information stream;
compare the CRC value with the new CRC value;
if the CRC value and the new CRC value differ, then repeat:
  alter a segment of the information steam to create an altered information stream;
  obtain a pointer based on the altered information stream;
  obtain from a data structure a value pointed to by the pointer;
  revise the new CRC value in accordance with the obtained value; and
  compare the CRC value with the new CRC value as revised.

19. The article of manufacture of claim 18, wherein the machine readable instructions, that when executed by a machine, cause the machine to receive an information stream and a cyclic redundancy check (CRC) value for the information stream, comprise machine readable instructions, that when executed by a machine, cause the machine to receive a string of binary digits representing the information stream and a CRC value derived from the string of binary digits representing information stream.

20. The article of manufacture of claim 19, wherein the machine readable instructions, that when executed by a machine, cause the machine to receive an information stream and a cyclic redundancy check (CRC) value for the information stream further comprises machine readable instructions, that when executed by a machine, cause the machine to identify a number of least reliable binary digits in the string of binary digits representing the information stream.

21. The article of manufacture of claim 18, wherein the machine readable instructions, that when executed by a machine, cause the machine to receive an information stream and a cyclic redundancy check (CRC) value for the information stream and compute a new CRC value for the information stream, comprises machine readable instructions, that when executed by a machine, cause the machine to receive an information stream and a cyclic redundancy check (CRC) value for the information stream computed in accordance with a CRC algorithm, and compute a new CRC value for the information stream in accordance with the CRC algorithm.

22. The article of manufacture of claim 21, wherein the machine readable instructions, that when executed by a machine, cause the machine to receive an information stream and a cyclic redundancy check (CRC) value for the information stream computed in accordance with a CRC algorithm, and compute a new CRC value for the information stream in accordance with the CRC algorithm, comprises machine readable instructions, that when executed by a machine, cause the machine to receive a string of binary digits representing the information stream and a cyclic redundancy check (CRC) value computed on the string of binary digits in accordance with a CRC algorithm, and compute a new CRC value on the string of binary digits representing the information stream in accordance with the CRC algorithm.

23. The article of manufacture of claim 18, wherein the machine readable instructions, that when executed by a machine, cause the machine to alter a segment of the information stream to create an altered information stream comprises machine readable instructions, that when executed by a machine, cause the machine to alter a segment of a string of binary digits that represents the information stream to create an altered string of binary digits that represent the information stream.

24. The article of manufacture of claim 23, wherein the machine readable instructions, that when executed by a machine, cause the machine to alter a segment of a string of binary digits that represents the information stream to create an altered string of binary digits that represent the information stream comprises machine readable instructions, that when executed by a machine, cause the machine to alter a number of binary digits in the string of binary digits that represents the information stream to create an altered string of binary digits that represent the information stream.

25. The article of manufacture of claim 24, wherein the machine readable instructions, that when executed by a machine, cause the machine to alter a number of binary digits in the string of binary digits that represents the information stream to create an altered string of binary digits that represent the information stream comprises machine readable instructions, that when executed by a machine, cause the machine to alter a plurality of binary digits in the string of binary digits that represents the information stream to create an altered string of binary digits that represent the information stream.

26. The article of manufacture of claim 25, wherein the machine readable instructions, that when executed by a machine, cause the machine to alter a plurality of binary digits in the string of binary digits that represents the information stream to create an altered string of binary digits that represent the information stream, comprises machine readable instructions, that when executed by a machine, cause the machine to alter a noncontinguous plurality of binary digits in the string of binary digits that represents the information stream to create an altered string of binary digits that represent the information stream.

27. The article of manufacture of claim 25, wherein the machine readable instructions, that when executed by a machine, cause the machine to alter a segment of the information stream to create an altered information stream, comprises machine readable instructions, that when executed by a machine, cause the machine to alter at least one of the number of least reliable binary digits in the string of binary digits representing the information stream to create an altered string of binary digits that represent the information stream.

28. The article of manufacture of claim 25, wherein the machine readable instructions, that when executed by a machine, cause the machine to obtain a pointer based on the altered information stream comprises machine readable instructions, that when executed by a machine, cause the machine to obtain a pointer based on the altered string of binary digits that represent the information stream.

29. The article of manufacture of claim 28, wherein the machine readable instructions, that when executed by a machine, cause the machine to obtain a pointer based on the altered string of binary digits that represent the information stream comprises machine readable instructions, that when executed by a machine, cause the machine to obtain an index based on the altered number of binary digits in the string of binary digits that presents the information stream.

30. The article of manufacture of claim 29, wherein the machine readable instructions, that when executed by a machine, cause the machine to obtain an index based on the altered number of binary digits in the string of binary digits that represents the information comprises machine readable instructions, that when executed by a machine, cause the machine to obtain a mask identifying a position at which the altered number of binary digits is located in the string of binary digits that represents the information stream.

31. The article of manufacture of claim 30, wherein the machine readable instructions, that when executed by a machine, cause the machine to obtain from a data structure a value pointed to by the pointer comprises machine readable instructions, that when executed by a machine, cause the machine to obtain from a look up table a value indexed by the mask.

32. The article of manufacture of claim 31, wherein the look up table comprises a number of entries equal to the number of binary digits in the mask.

33. The article of manufacture of claim 31, wherein the value in each entry of the look up table represents the extent to which the new CRC value will be revised by altering the number of binary digits in the string binary digits that represents the information stream at the position indicated by the mask.

34. The article of manufacture of claim 31, wherein the machine readable instructions, that when executed by a machine, cause the machine to revise the new CRC value in accordance with the obtained value comprises machine readable instructions, that when executed by a machine, cause the machine to add the value indexed by the mask to the new CRC value to create the new CRC value as revised.

* * * * *